(12) United States Patent
Feltner et al.

(10) Patent No.: US 6,457,251 B1
(45) Date of Patent: Oct. 1, 2002

(54) METHOD AND APPARATUS FOR CALIBRATING DEVICE PICK-UP HEADS USED IN INTEGRATED CIRCUIT HANDLER SYSTEMS

(75) Inventors: Thomas A. Feltner, Tracy, CA (US); John C. Marley, San Jose, CA (US)

(73) Assignee: Xilinx Inc., San Jose, CA (US)

( * ) Notice: Subject to any disclaimer, the term of this patent is extended or adjusted under 35 U.S.C. 154(b) by 53 days.

(21) Appl. No.: 09/652,386

(22) Filed: Aug. 31, 2000

(51) Int. Cl.⁷ .................................................. G01B 3/30
(52) U.S. Cl. .............................. 33/567; 33/502; 73/1.79
(58) Field of Search ............................... 33/567, 501.45, 33/502; 73/1.01, 1.79, 1.81

(56) References Cited

U.S. PATENT DOCUMENTS

| | | | | |
|---|---|---|---|---|
| 2,332,360 A | * | 10/1943 | Wakefield | 33/567 |
| 2,536,401 A | * | 1/1951 | Victor | 33/567 |
| 3,845,560 A | * | 11/1974 | Sommer | 33/567 |
| 4,642,900 A | * | 2/1987 | Provost et al. | 33/567 |
| 5,134,781 A | * | 8/1992 | Baker | 33/502 |
| 5,501,096 A | * | 3/1996 | Stettner et al. | 73/1.79 |

* cited by examiner

*Primary Examiner*—Christopher W. Fulton
(74) *Attorney, Agent, or Firm*—Patrick T. Bever

(57) ABSTRACT

A calibration assembly and method for calibrating the device pick-up heads used in multi-head IC handlers such that all of the device pick-up heads are reliably calibrated to a consistent optimal calibration position. Gauge blocks are provided that greatly simplify the calibration process by holding the movable portion of a device pick-up head in an optimal calibration position relative to the base structure of the device pick-up head while the collar is secured. Each gauge block has base portion for supporting the base structure of the device pick-up head, and a flat contact surface against which the lower surface of the movable portion is pressed. The contact surface is a predetermined distance from the base portion such that when the device pick-up head is mounted on the gauge block, the movable portion is maintained in an optimal calibration position relative to the base structure.

12 Claims, 3 Drawing Sheets

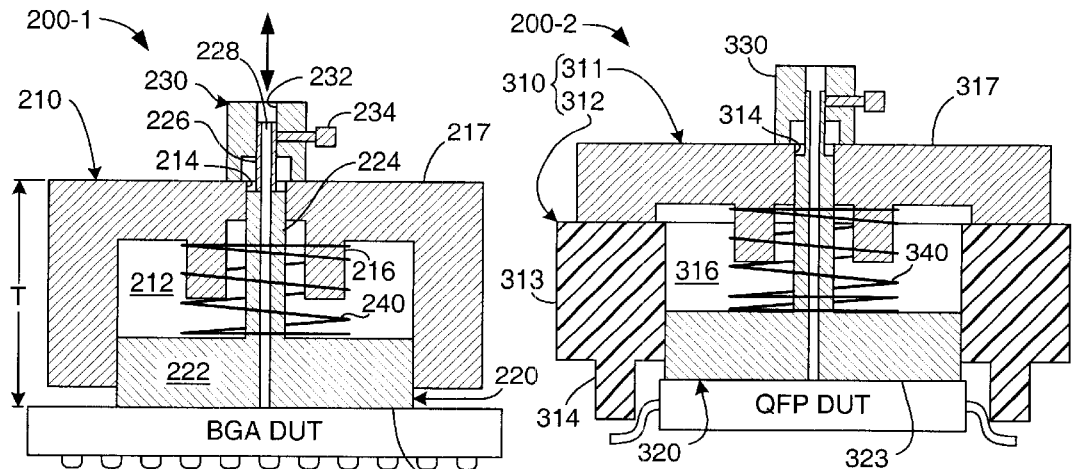
FIG. 2 (PRIOR ART)
FIG. 3 (PRIOR ART)
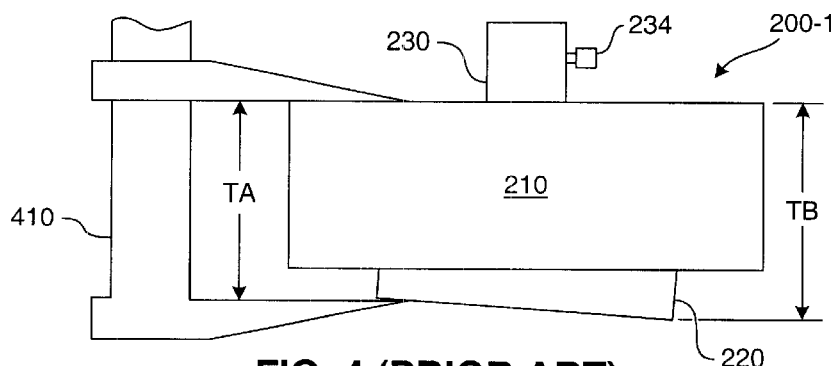
FIG. 4 (PRIOR ART)
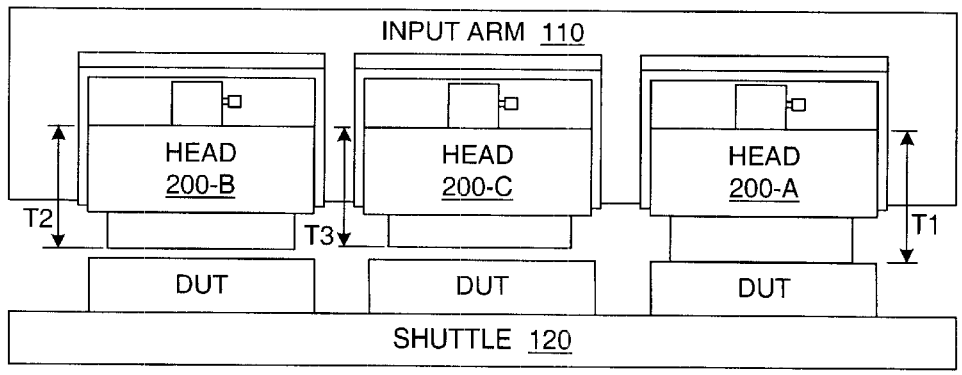
FIG. 5 (PRIOR ART)

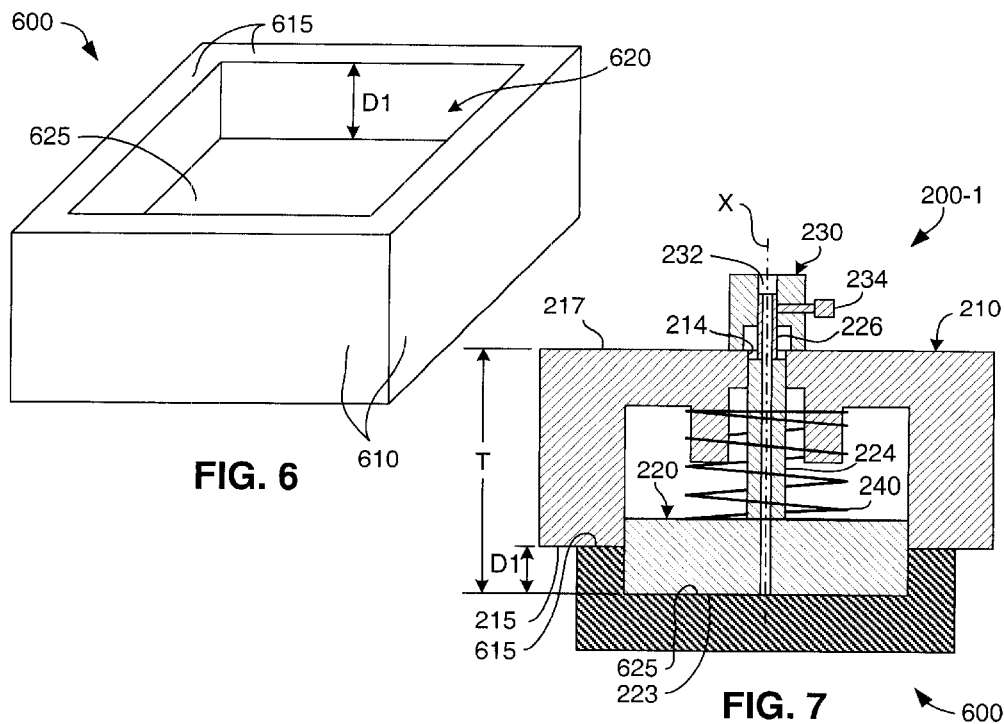
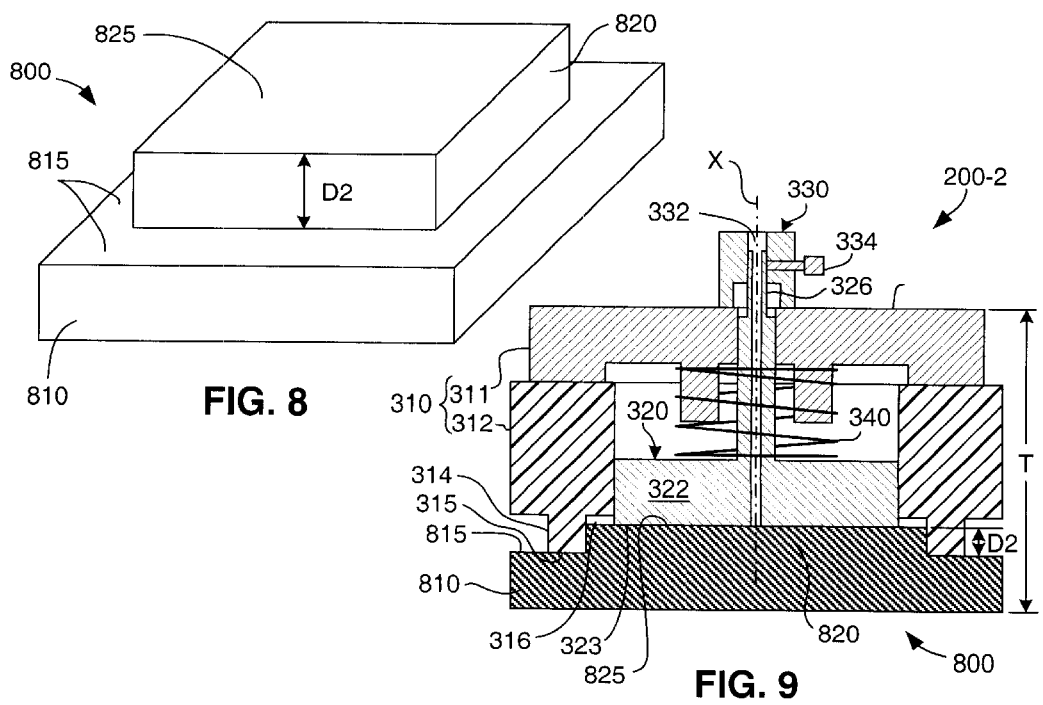

METHOD AND APPARATUS FOR CALIBRATING DEVICE PICK-UP HEADS USED IN INTEGRATED CIRCUIT HANDLER SYSTEMS

FIELD OF THE INVENTION

The present invention relates to automated test equipment for testing integrated circuits (ICs), and more particularly to apparatus and methods for calibrating the device pick-up heads used in IC handler systems.

RELATED ART

Packaged integrated circuits (ICs) are typically tested prior to sale. Testing is typically carried out using automatic test equipment (ATE) that includes an IC test signal generator (IC tester), a test fixture (e.g., a socket) for transmitting electrical signals from the IC test signal generator to an IC device-under-test (DUT), and a handler system that moves the DUTs between a shipping tray and the test fixture. This testing process is typically used to identify non-functional ICs.

FIG. 1 is a block diagram showing a handler system 100 used to move packaged IC DUTs between shipping trays 50 and an IC tester 70. Handler system 100 is consistent with pick-and-place handler systems produced by, for example, Seiko Epson Corp. and sold under model number HM3000 (Hummingbird).

Handler system 100 includes an input arm 110 that moves DUTs between shipping tray 50 and a shuttle 120, and a test arm 130 that moves DUTs between shuttle 120 and a test fixture 140. An optional soaking tray 150 is provided between shipping tray 50 and shuttle 120 to facilitate heating or cooling of the DUTs before testing.

Input arm 110 is driven by a positioning mechanism (not shown) to move horizontally over shipping tray 50, soaking tray 150, and shuttle 120, and includes one or more vertically movable frames (referred to as "hands") 115, each hand 115 supports one device pick-up head 200. Each device pick-up head 200 includes a base structure 210 held by an associated hand 115, and a movable portion 220 that transmits a vacuum pressure used to secure and pick-up DUTs during movement from one location to another. Specifically, to moved DUTs between shipping tray 50 and soaking tray 150, input arm 110 is moved horizontally over shipping tray 50, and then hands 115 are lowered until movable portions 220 of each device pick-up head 200 contact the upper surface of the DUTs stored on shipping tray 50. Next, vacuum pressure is transmitted to device pick-up heads 200 to secure the DUTs, and the hands are moved upward from shipping tray 50, thereby lifting the DUTs. Input arm 110 is then moved horizontally over soaking tray 150, and hands 115 are lowered until the DUTs contact soaking tray 150. The vacuum pressure is then released, and a brief positive pressure (puff) is transmitted to each device pick-up head 200, thereby separating the DUTs from device pick-up heads 200. Finally, device pick-up heads 200 are moved upward from soaking tray 150. A similar sequence of steps is used to move the DUTs from soaking tray 150 to shuttle 120, and from shuttle 120 back to shipping tray 50 after testing is completed.

Shuttle 120 is driven by a horizontal positioning mechanism (not shown) to move between a first position accessible by input arm 110, and a second position accessible by test arm 130. As depicted in FIG. 1, shuttle 120 moves between a staging/soaking (upper) area from which the DUTs are loaded and unloaded by input arm 110, and a test (lower) area where the DUTs are loaded and unloaded by test arm 130.

Similar to input arm 110, test arm 130 is driven by a positioning mechanism (not shown) to move horizontally between shuttle 120 (when located in the test (lower) area) and test fixture 140. Test arm 130 includes one or more vertical movable hands 135, each supporting a device pick-up head 200 that includes a base structure 210 and a movable portion 220. Test arm 130 uses a sequence of movements similar to that described above for input arm 110 to move DUTs between shuttle 120 and test fixture 140. After tests are performed using test signals transmitted from IC tester 70, the DUTs are picked up by device pick-up heads 200, and returned to shuttle 120, which in turn returns the tested DUTs to the staging/soaking (upper) area (see FIG. 1) for replacement onto shipping tray 50.

FIG. 2 is a cross-sectional side view showing a simplified device pick-up head 200-1 that is similar to device pick-up heads mounted on both input arm 110 and test arm 130 when handler system 100 is used to test BGA packaged DUTs.

Device pick-up head 200-1 includes a rigid (e.g., aluminum) base structure 210, a movable portion 220, an adjustment collar 230, and a spring 240 for biasing movable portion 220 away from base structure 210. Base structure 210 defines an opening 212 and a hole 214 for slidably receiving movable portion 220, and a spring mounting structure 216 for holding an upper portion of spring 240. Movable portion 220 includes a base 222 that is slidably received in opening 212 of base structure 210 such that its lower surface 223 faces away from opening 212, a shaft 224 extending upward from base 222 through hole 214, and a narrow connection tube 226 extending from the upper end of shaft 224. A central passage 228 extends through base 222, shaft 224, and connection tube 226 to facilitate the transmission of vacuum pressure from a source (not shown) to lower surface 223 of base 222 for purposes of securing BGA DUTs. Finally, collar 230 includes a central opening 232 for receiving connection tube 228 of movable portion 220, and a set screw 234 for securing collar to connection tube 228.

As described above, during operation, device pick-up head 200-1 is moved by an arm (e.g., input arm 110 or test arm 130) horizontally over a BGA DUT, and then moved by a hand (e.g., hand 115 or hand 135) vertically down onto the BGA DUT, which is located in a first location (e.g., shipping tray 50; see FIG. 1). Vacuum pressure is then transmitted from a source (not shown) through central passage 228 to pull the BGA DUT against lower surface 223 of base 222. Head structure 200-1 is then lifted with the BGA DUT and moved over a second position (e.g., shuttle 120). Head structure 200-1 is then lowered onto the second position, and then the vacuum pressure is released. More specifically, a puff of relatively high pressure air is transmitted down central passage 228 to push the BGA DUT away from base 222.

FIG. 3 is a cross-sectional side view showing a simplified device pick-up head 200-2 that is similar to device pick-up heads mounted on both input arm 110 and test arm 130 when handler system 100 is used to test DUTs that have leads extending from their package (e.g., dual-inline package (DIP) DUTs, quad-flat-pack (QFP) DUTS, or plastic leaded chip carrier (PLCC) packaged DUTS).

Device pick-up head 200-2 includes a movable portion 320, a collar 330, and a spring 340 that are essentially identical to pick-up portion 220, collar 230, and spring 240, respectively, of device pick-up head 200-1, and function in a similar manner. However, a base structure 310 of device pick-up head 200-2 differs from base structure 210 in that it includes a metal (e.g., aluminum) base 311 that is fixedly mounted to a plastic blade pack 312. Metal base 311 defines a hole 314 for slidably supporting movable portion 320. Blade pack 312 includes a set of box-like outer walls 313 that extend down from metal base 311, and includes a narrow ridge (protrusion) 314 extending from a lower edge of outer walls 313 that is used to push the leads of a QFP DUT onto a test fixture (such as test fixture 140; see FIG. 1). Lower surface 323 of movable portion 320 and the lower portion of blade pack 312 combine to form an opening 316 into which, for example, a QFP DUT is received during handler operation.

FIG. 4 illustrates a conventional method used to calibrate device pick-up head 200-1 using a caliper 410 according to conventional methods. Referring briefly to FIG. 2, the conventional method involves loosening set screw 234 and sliding movable portion 220 upward relative to base structure 210 until a distance measured from the top surface 217 of base structure 210 to lower surface 223 of movable portion 220 is equal to a predetermined distance T. According to the conventional method, this process is typically performed using caliper 410 to determine when the bottom surface of movable portion 220 is in the proper position before tightening set screw 234 of collar 230. Referring again to FIG. 4, set screw 234 is then tightened against connection tube 226 (with collar 230 resting against the top surface of base structure 210), thereby restricting the downward movement of movable portion 220 relative to base structure 210.

Referring briefly to FIG. 3, head structure 200-2 is typically calibrated by pushing a part (e.g., QFP DUT) against movable portion 320 until a desired position is achieved (measured by eye), and then collar is secured such that lower surface 323 of movable portion 320 is maintained at a proper distance below a top surface 317 of base structure 310.

Referring again to FIG. 4, a first problem associated with the conventional calibration method is that adjustments set using caliper 410 are potentially inaccurate due to misalignment of movable portion 220. Specifically, the pressure applied by caliper 410 on one side of movable portion 220 can cause movable portion 220 to rotate slightly toward caliper 410, thereby causing a slight misalignment between an axis defined by shaft 226 and a corresponding axis defined by hole 214 (shown in FIG. 2) of base structure 210. This rotation causes a small deviation between the measured distance TA and a distance TB existing at the opposite side of movable portion 220. Accordingly, when caliper 410 is removed and movable portion 220 rotates back to a perpendicular position, the actual calibration distance is between TA and TB.

FIG. 5 shows input arm 110 of handler system 100 (see FIG. 1) for purposes of illustrating a second problem associated with the conventional calibration method. Because each device pick-up head 200-A, 200-B, and 200-C mounted on input arm 110 is adjusted independently using a caliper, which is inherently inaccurate due, for example, to slight tolerance variations, it is possible for each head to have a different calibration setting. That is, because different tolerances will generate different amounts of deviation from the desired calibration distance, accurate calibration of head structure 200 is difficult and unreliable. For example, as indicated in FIG. 5, the rightmost device pick-up head 200-A is set at a calibration distance T1 that results in contact with the rightmost DUT, while the leftmost device pick-up head 200-B is set at a smaller calibration distance T2 that is slightly above the leftmost DUT, and the central device pick-up head 200-C is set at a third calibration distance T3 that is even further above the central DUT. Although the variation in distances T1, T2, and T3 is exaggerated for clarity, the problem caused by inconsistent head calibration is easily understood. Specifically, if device pick-up heads 200-A, 200-B, and 200-C are positioned as shown in FIG. 5 and a vacuum pressure is supplied, there is a chance that only the rightmost DUT will be lifted, thereby preventing the other two DUTs from being tested and increasing testing costs. On the other hand, if device pick-up heads 200-B and 200-C are moved downward far enough to contact the leftmost and central DUTs, the rightmost DUT may be crushed by device pick-up head 200-A, thereby increasing average production costs. Accordingly, the process of calibrating device pick-up heads 200-A, 200-B, and 200-C to consistent settings is both difficult and time consuming. Further, referring to FIG. 1, because the device pick-up heads mounted on input arm 110 must be calibrated consistent with the device pick-up heads mounted on test arm 130, it is easy to appreciate the large amount of time required to prepare handler system 100 for a test run.

What is needed is a method and apparatus for calibrating device pick-up heads and device pick-up heads of IC device handlers that avoids the problems associated with the prior art.

SUMMARY

The present invention is directed to a calibration assembly and method for calibrating the device pick-up heads used in multi-head IC handlers such that all of the device pick-up heads are reliably calibrated to a consistent optimal calibration position. According to the present invention, gauge blocks are provided that greatly simplify the calibration process by holding the movable portion of a device pick-up head in an optimal calibration position relative to the base structure of the device pick-up head while the collar is secured. Each gauge block has base portion for supporting the base structure of the device pick-up head, and a flat contact surface against which the lower surface of the movable portion is pressed. The contact surface is a predetermined distance from the base portion such that when the device pick-up head is mounted on the gauge block, the movable portion is maintained in an optimal calibration position relative to the base structure, thereby providing a reliable and repeatable method of calibrating all of the device pick-up heads used in a multi-head IC handler. Further, when a device pick-up head is mounted on the gauge block, the movable portion presses against the contact surface of the gauge block such that the axis of the movable portion shaft is coincident with the base structure hole, thereby avoiding inaccurate calibration that can occur using calipers.

In accordance with a first embodiment of the present invention, a gauge block is provided for calibrating device pick-up heads used to handle BGA-packaged ICs. This BGA-type gauge block includes an outer wall surrounding a central chamber. The base surface of this BGA-type gauge block is located on an upper edge of the outer wall such that the base structure of the device pick-up head rests on the upper edge of the outer wall when the lower surface of the movable portion presses against the contact surface. In addition, the contact surface is located inside the central chamber such that the movable portion of the device pick-up head extends into the central chamber when the lower surface presses against the contact surface. Accordingly, a depth of the central chamber, which is defined by a distance between the contact surface and the upper edge of the outer wall, is equal to the predetermined distance such that the movable portion is maintained in the optimal calibration position relative to the base structure when the lower surface of the movable portion presses against the contact surface.

In accordance with a first embodiment of the present invention, a gauge block is provided for calibrating device pick-up heads used to handle ICs in leaded packages (e.g., DIP or QFP packaged ICs). This leaded IC-type gauge block includes a base portion surrounding a central protrusion. The base surface of the leaded IC-type gauge block is located on an upper edge of the base portion such that the base structure of the device pick-up head rests on the upper edge of the base portion. In addition, the contact surface of the gauge block is located on top of the central protrusion such that, when the lower surface presses against the contact surface, the central protrusion extends into an opening formed by the base structure. Similar to the BGA-type gauge block, a height of the central protrusion of the leaded IC-type gauge block is defined by a distance between the contact surface and the upper edge of the base portion, and is set such that the movable portion is in the optimal calibration position relative to the base structure when the lower surface of the movable portion presses against the contact surface.

The present invention will be more fully understood in view of the following description and drawings.

BRIEF DESCRIPTION OF THE DRAWINGS

FIG. 2 is a cross-sectional side view showing a simplified test/device pick-up head utilized to pick-and-place BGA-packaged ICs in the ATE arrangement shown in FIG. 1;

FIG. 3 is a cross-sectional side view showing a simplified test/device pick-up head utilized to pick-and-place QFP DUTs in the ATE arrangement shown in FIG. 1;

FIG. 4 is a side view depicting a conventional device pick-up head calibration method using calipers;

FIG. 5 is a diagram depicting a simplified input arm of the ATE arrangement shown in FIG. 1;

FIG. 6 is a perspective view showing a gauge block for calibrating test/device pick-up heads according to a first embodiment of the present invention;

FIG. 7 is a cross-sectional side view depicting a method of calibrating a test/device pick-up head utilizing the gauge block shown in FIG. 6;

FIG. 8 is a perspective view showing a gauge block for calibrating test/device pick-up heads according to a second embodiment of the present invention; and FIG. 9 is a cross-sectional side view depicting a method of calibrating a test/device pick-up head utilizing the gauge block shown in FIG. 7.

DETAILED DESCRIPTION

Figure 1:
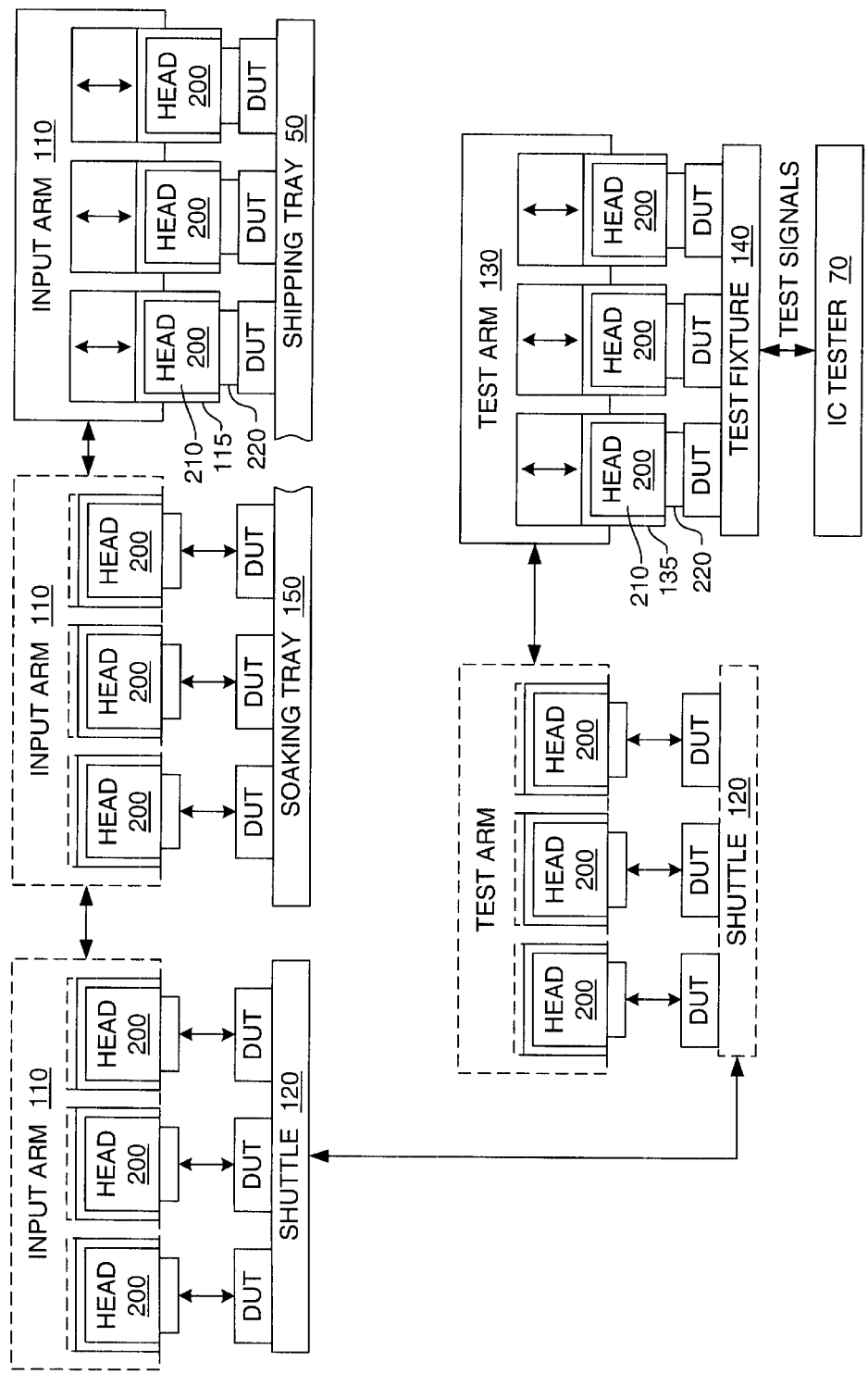
FIG. 1 is a diagram depicting a simplified conventional ATE arrangement.

FIG. 6 is a perspective view showing a gauge block 600 according to a first embodiment of the present invention. As described below, gauge block 600 is used to calibrate device pick-up heads 200-1 similar to those described above in the background section. Gauge block 600 includes box-like outer walls (base structure) 610 surrounding a central chamber 620, a depth D1 of central chamber 620 being measured from an upper edge (base surface) 615 of outer walls 610 to a contact surface 625 located inside of central chamber 620. According to an aspect of the present invention, the depth D1 corresponds to an optimal calibration position of movable portion 220 relative to base portion 210 (see FIG. 2).

FIG. 7 is a cross sectional side view showing an assembly including device pick-up head 200-1 mounted onto gauge block 600 during a calibration process provided in accordance with the first embodiment. This calibration process may begin by loosening set screw 234 of collar 230 to allow free movement of movable portion 220 relative to collar 230. When device pick-up head 200-1 is mounted onto gauge block 600, spring 240 biases movable portion 220 downward such that lower surface 223 of movable portion 220 presses against contact surface 625. By selectively setting the depth D1 of gauge block 600, movable portion 220 is automatically set into an optimal calibration position relative to base structure 210 when mounted on gauge block 600 in this manner. Specifically, as indicated in FIG. 7, the downward position of movable portion 220 is restricted by contact between lower surface 223 and contact surface 625 such that lower surface 223 is maintained at distance D1 from bottom surface 215 of base structure 210. By selectively setting distance D1 as indicated, movable portion 220 is held by gauge block 600 at the optimal calibration position T relative to base structure 210 when lower surface 223 presses against contact surface 625. Accordingly, the calibration process is easily performed by sliding collar 230 against upper surface 217 of base structure 210 and securing collar 230 to movable portion 220 by tightening set screw 234 against connection tube 226.

According to another aspect of the present invention, contact surface 625 is flat or otherwise formed such that, when lower surface 223 is pressed against inner surface 625, lower surface 223 is held perpendicular to an axis X defined by hole 214 (i.e., the axis defined by shaft 224 and connection tube 226 coincides with the axis X defined by hole 214 of base structure 210). Accordingly, the present invention facilitates the calibration of multiple device pick-up heads 200-1 into the optimal calibration position in a relatively short amount of time without adjustment inaccuracies caused by slight tolerance variations of the device pick-up heads, as occurs in prior art calibration methods using calipers.

FIG. 8 is a perspective view showing a gauge block 800 according to a second embodiment of the present invention. As described below, gauge block 800 is used to calibrate device pick-up heads 200-2 similar to those described above in the background section. Gauge block 800 is formed as two-tiered platform having a base portion 810 surrounding a central protrusion 820, a height D2 of central protrusion 820 being measured from an upper edge (base surface) 815 of base portion 810 to a contact surface 825 located on top of central protrusion 820. According to an aspect of the present invention, the height D2 corresponds to an optimal calibration position of movable portion 320 relative to base portion 310 of device pick-up head 200-2 (see FIG. 3).

FIG. 9 is a cross sectional side view showing an assembly including device pick-up head 200-2 mounted onto gauge block 800 during a calibration process provided in accordance with the second embodiment. This calibration process may begin by loosening set screw 334 of collar 330 to allow free movement of movable portion 320 relative to collar 330. When device pick-up head 200-2 is mounted onto gauge block 800, spring 340 biases movable portion 320 downward such that lower surface 323 of movable portion 320 presses against contact surface 825. By selectively setting the height D2 of gauge block 800, movable portion 320 is automatically set into an optimal calibration position relative to base structure 310 when mounted on gauge block 800 in this manner. Specifically, as indicated in FIG. 9, the downward position of movable portion 320 is restricted by contact between lower surface 323 and contact surface 825 such that lower surface 323 is maintained at distance D2 from a bottom surface 315 that is located on protrusion 314 of blade pack 312, which is part of base structure 310. By selectively setting distance D2 as indicated, movable portion 320 is held by gauge block 800 at the optimal calibration position T relative to base structure 310 when lower surface 323 presses against contact surface 825. Accordingly, the calibration process is easily performed by sliding collar 330 against upper surface of base structure 310 and securing collar 330 to movable portion 320 by tightening set screw 334 against connection tube 326.

As suggested above, in addition to the specific embodiments disclosed herein, other modifications to the test methods of the present invention are also possible that fall within the spirit and scope of the present invention. Therefore, the invention is limited only by the following claims.

What is claimed is:

1. A method for calibrating a device pick-up head used in an integrated circuit handler system, the method comprising:
   mounting the device pick-up head onto a gauge block having a base surface surrounding a contact surface, wherein the contact surface is a predetermined distance from the base surface such that when a base structure of the device pick-up head contacts the base surface of the gauge block, a lower surface of a movable portion of the device pick-up head presses against the contact surface of the gauge block, and the movable portion is maintained in an optimal calibration position relative to the base structure; and
   securing a collar of the device pick-up head to the movable portion such that the movable portion is biased into the optimal position.

2. The method according to claim 1, further comprising loosening a set screw mounted on the collar such that the movable portion is freely slidable relative to the collar during mounting.

3. The method according to claim 2, wherein securing the collar comprises tightening the set screw.

4. The method according to claim 1, wherein the contact surface is arranged such that the lower surface of the movable portion is perpendicular to a central axis of the movable portion when the lower surface of the movable portion presses against the contact surface during mounting.

5. The method according to claim 1,
   wherein the gauge block includes an outer wall surrounding a central chamber, the base surface being located on an upper edge of the outer wall such that the base structure of the device pick-up head rests on the upper edge of the outer wall during mounting,
   wherein the contact surface is located inside the central chamber such that the movable portion of the device pick-up head extends into the central chamber when the lower surface presses against the contact surface, and
   wherein a depth of the central chamber, defined by a distance between the contact surface and the upper edge of the outer wall, is equal to the predetermined distance such that the movable portion is in the optimal calibration position relative to the base structure when the lower surface of the movable portion presses against the contact surface during mounting.

6. The method according to claim 1,
   wherein the gauge block includes a base portion surrounding a central protrusion, the base surface being located on an upper edge of the base portion such that the base structure of the device pick-up head rests on the upper edge of the base portion during mounting,
   wherein the contact surface is located on top of the central protrusion such that when the lower surface presses against the contact surface, the central protrusion extends into an opening formed by the base structure, and
   wherein a height of the central protrusion, defined by a distance between the contact surface and the upper edge of the base portion, is equal to the predetermined distance such that the movable portion is in the optimal calibration position relative to the base structure when the lower surface of the movable portion presses against the contact surface during mounting.

7. A calibration assembly comprising a gauge block and a device pick-up head used in an integrated circuit handler system, the device pick-up head including:
   a base structure having a bottom surface surrounding an opening; and
   a movable portion that is slidably received in the opening of the base structure such that a lower surface of the movable portion faces outward from the opening;
   wherein the gauge block comprises a base surface surrounding a contact surface, the contact surface being a predetermined distance from the base surface such that when the bottom surface of the base structure contacts the base surface of the gauge block and the lower surface of a movable portion presses against the contact surface of the gauge block, the movable portion is maintained in an optimal calibration position relative to the base structure.

8. The calibration assembly according to claim 7,
   wherein the base structure of the device pick-up head further includes a top surface defining a hole,
   wherein the movable portion further includes a contact portion having the lower surface formed thereon, the movable portion also having a shaft extending upward from the contact portion through the hole formed in the base structure, and
   wherein the device pick-up head further comprises a spring for biasing the contact portion toward the contact surface of the gauge block.

9. The calibration assembly according to claim 7,
   wherein the movable portion further comprises a connection tube extending from the upper end of the shaft, and
   wherein the device pick-up head further comprises a collar including a central opening for receiving connection tube of the movable portion, and a fastener for securing the collar to the connection tube when the movable portion is in the optimal calibration position.

10. The calibration assembly according to claim 7, wherein the contact surface is arranged such that the lower surface of the movable portion is perpendicular to a central axis of the movable portion when the lower surface of the movable portion presses against the contact surface.

11. The calibration assembly according to claim 7,
   wherein the gauge block includes an outer wall surrounding a central chamber, the base surface being located on an upper edge of the outer wall such that the base structure of the device pick-up head rests on the upper edge of the outer wall when the lower surface of the movable portion presses against the contact surface,
   wherein the contact surface is located inside the central chamber such that the movable portion of the device pick-up head extends into the central chamber when the lower surface presses against the contact surface, and
   wherein a depth of the central chamber, defined by a distance between the contact surface and the upper edge of the outer wall, is equal to the predetermined distance such that the movable portion is in the optimal calibration position relative to the base structure when the lower surface of the movable portion presses against the contact surface.

12. The calibration assembly according to claim 7, wherein the gauge block includes a base portion surrounding a central protrusion, the base surface being located on an upper edge of the base portion such that the base structure of the device pick-up head rests on the upper edge of the base portion, wherein the contact surface is located on top of the central protrusion such that when the lower surface presses against the contact surface, the central protrusion extends into an opening formed by the base structure, and wherein a height of the central protrusion, defined by a distance between the contact surface and the upper edge of the base portion, is equal to the predetermined distance such that the movable portion is in the optimal calibration position relative to the base structure when the lower surface of the movable portion presses against the contact surface.

* * * * *